324-77.                SR 02-08-72     XR     3,641,442

United States Patent

[15] 3,641,442

[45] Feb. 8, 1972

Boucher

[54] DIGITAL FREQUENCY SYNTHESIZER

[72] Inventor: Robert J. Boucher, Los Angeles, Calif.

[73] Assignee: Hughes Aircraft Company, Culver City, Calif.

[22] Filed: June 25, 1970

[21] Appl. No.: 49,688

[52] U.S. Cl. ....................................307/14, 328/37, 328/187, 307/215, 307/218, 331/40, 324/77 B

[51] Int. Cl. ....................................................H03b 19/00

[58] Field of Search ..................328/37, 15, 187, 14; 331/38, 331/40, 45, 56; 324/77 B, 83 D; 307/215, 218

[56] References Cited

UNITED STATES PATENTS

| | | | |
|---|---|---|---|
| 2,766,379 | 10/1956 | Pugsley | 328/187 X |
| 3,293,561 | 12/1966 | Hegarty et al. | 331/38 |
| 3,464,018 | 8/1969 | Cliff | 328/187 X |
| 3,537,026 | 10/1970 | Leonard | 331/40 X |

*Primary Examiner*—John S. Heyman
*Attorney*—W. H. MacAllister and George Jameson

[57] ABSTRACT

A system for generating any frequency in a desired band where, in one embodiment, a phase shifting circuit converts the output signal of a reference oscillator into a plurality of incremental phase shifts which are respectively applied to a plurality of gating circuits. In response to a multibit binary word, adder and register circuits combine to add the multibit binary word to itself at each occurrence of clock pulses and apply the four most significant bits of the sum therefrom to each of the plurality of gating circuits in order to selectively control the operation of the plurality of gating circuits to produce an output signal whose frequency is a function of the amplitude of the multibit binary word.

23 Claims, 4 Drawing Figures

INVENTOR.
ROBERT J. BOUCHER,
BY
Walter J. Adam
ATTORNEY.

DIGITAL FREQUENCY SYNTHESIZER

BACKGROUND OF THE INVENTION

1. Field of the Invention

This invention relates to frequency synthesizers and particularly to a digital phase shift frequency synthesizer.

2. Description of the Prior Art

In the prior art, one type of frequency synthesizer combines a large number of oscillators in an appropriate manner to generate any of a plurality of frequencies within a predetermined frequency band. For example, 20 oscillators, each one having two basic frequencies, may be utilized to provide over one million ($2^{20}$) combinations of frequencies that can be generated. However, a plurality of mixers and intermediate frequency (IF) amplifiers must be associated with the plurality of oscillators for proper frequency synthesis. These pluralities of oscillators, mixers and IF amplifiers produce a relatively expensive, bulky and very complicated arrangement. Furthermore, a change from one output frequency to another output frequency, by changing from one combination of oscillators to another, is not phase coherent.

A second type of frequency synthesizer in the prior art counts down from very high frequency clock pulses and smooths the resulting square wave. To illustrate, a 1 megahertz (MHz) clock frequency may be counted down to operate at one of a plurality of output frequencies within some lower frequency range. Each time that the countdown rate is increased by one, one additional microsecond is added to the average output interpulse period. Output frequencies of 1 Hz., 1,000 Hz. and 50 kHz. would result in respective incremental changes of 1 part in a million, 1 part in a thousand and 1 part in 20. As the clock frequency is approached, the incremental changes get closer and closer together. As a result the time steps are uniform but the frequency steps change significantly, particularly at the higher frequencies.

A third type of frequency synthesizer in the prior art would utilize a low-frequency reference oscillator to lock a voltage controlled oscillator to one of a plurality of harmonics of the reference oscillator in order to generate one of a plurality of output frequencies. This method is adequate if not too many different output frequencies are involved. However, if too many different output frequencies are involved, it is difficult to lock the voltage controlled oscillator to the desired harmonic to produce the required output frequency. Furthermore, the system is limited in operation to a relatively narrow frequency band comprised of only harmonics of the fundamental frequency of the reference oscillator.

SUMMARY OF THE INVENTION

Briefly, applicant has provided a digital frequency synthesizer which accumulates digital quantities in an adder-register configuration at a clock pulse rate to selectively gate a plurality of incremental phase shifts of an oscillator-signal from a plurality of segments of a phase shifting circuit in order to develop an output signal at a controllable output frequency.

It is therefore an object of this invention to provide a system for digitally controlling the frequency of a reference oscillator.

Another object of this invention is to provide a system for synthesizing any one of a plurality of output frequencies within a desired frequency band.

Another object of this invention is to provide a frequency synthesizer system capable of very rapid switching in output frequency while retaining phase coherency during the frequency changes.

Another object of this invention is to provide an improved digital phase shift frequency synthesizer which provides a large number of phase shift increments per output cycle in equally spaced frequency increments.

A further object of this invention is to provide a relatively simple, compact and economical digital frequency synthesizer.

BRIEF DESCRIPTION OF THE DRAWINGS

These and other objects, features and advantages of the invention, as well as the invention itself, will become more apparent to those skilled in the art in the light of the following detailed description taken in consideration with the accompanying drawings wherein like reference numerals indicate like or corresponding parts throughout the several views wherein.

DESCRIPTION OF THE PREFERRED EMBODIMENTS

Figure 1:
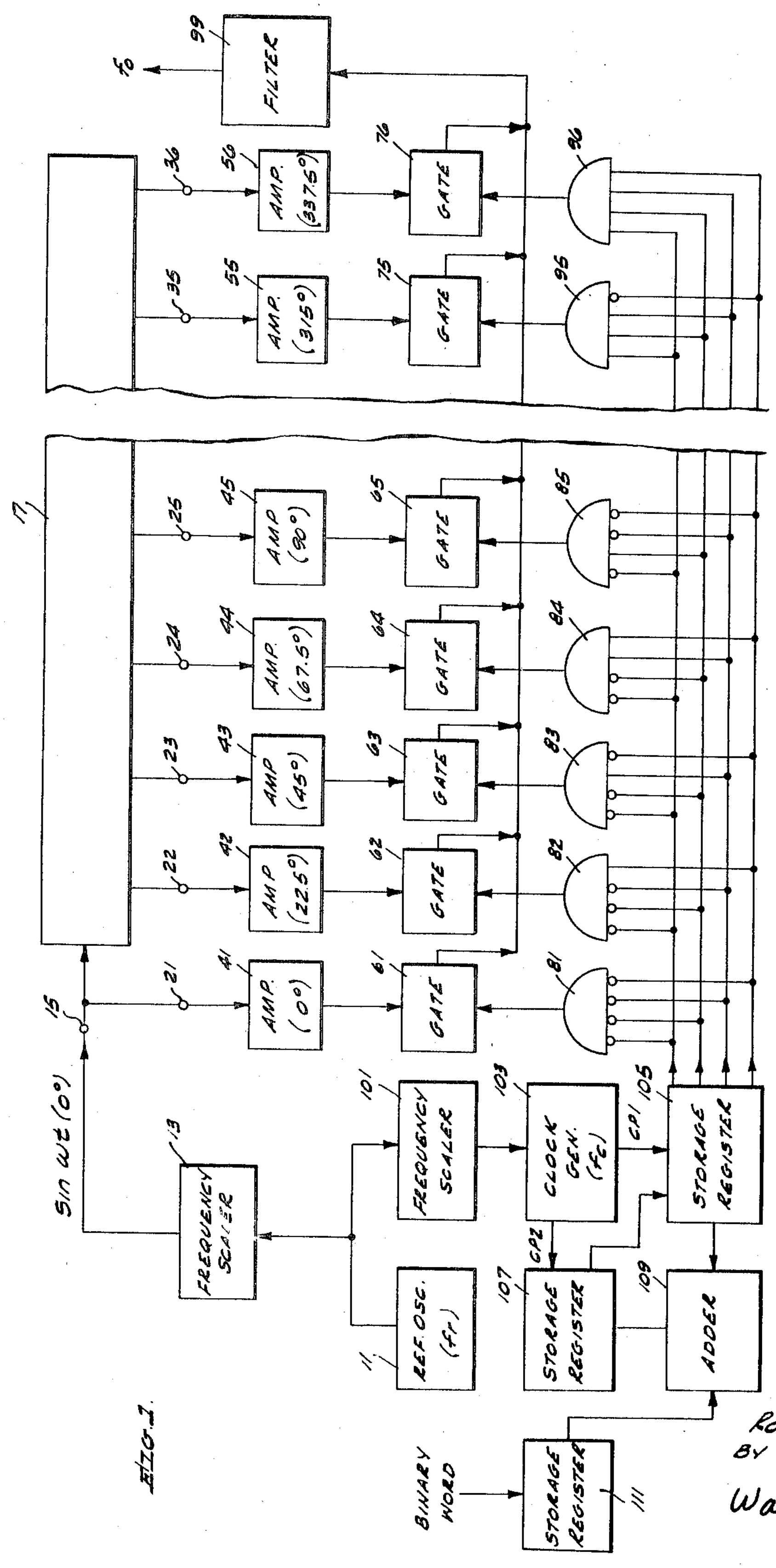
FIG. 1 is a schematic block diagram of a digital frequency synthesizer in accordance with one embodiment of this invention.

Referring now to the drawings, FIG. 1 illustrates a schematic block diagram of a digital frequency synthesizer in accordance with one embodiment of this invention. A reference oscillator 11, which may be a conventional crystal oscillator, generates a stable sinusoidal signal at a frequency of $f_r$ which, for example, may be 640 kHz. This stable sinusoidal signal from the oscillator 11 is applied to a frequency scaler circuit 13 which may be operated as either a frequency multiplier or a frequency divider. For this discussion the frequency scaler circuit 13 will be operated as a divide-by-two frequency divider which produces a sinusoidal signal sin $\omega t$ at a frequency of 320 kHz. The signal sin $\omega t$ is passed through a terminal 15 to a tapped phase shifting circuit or tapped delay line 17 which develops N–1 different delayed output signals. It should, however, be realized that a phase shifting circuit other than the tapped delay line 17 may be utilized. For example, a plurality of cascade-coupled, resistance-capacitive networks having components of suitable sizes and arranged in suitable configurations, or a plurality of tapped resistance networks selectively fed by negative and positive polarity quadrature signals may be utilized to produce the N–1 different delayed output signals, as is apparent to those skilled in the art. Each succeeding delayed output signal of the delay line 17 shifts the phase of the incoming sinusoidal sin $\omega t$ by an additional incremental phase shift of $\Delta\theta$, where $\Delta\theta = 360°/N$.

In the embodiment of FIG. 1 assume that 16 different incremental phase shifts are desired. As a result $N$ equals 16 and therefore each incremental phase shift $\Delta\theta$ equals 22.5°. It should be understood, however, that $N$ could equal any desired integer. An undelayed signal sin $\omega t$ from the terminal 15 and the $N$–$1$ 15 delayed output signals from the tapped delay line 17 are respectively applied through the terminals 21 through 36 to amplifiers 41 through 56, which are selectively adjusted to provide equal amplitude output signals to compensate for various losses in the delay line 17.

The equal amplitude output signals from the amplifiers 41 through 56 differ in phase from the signal sin $\omega t$ by the respective incremental phase shifts of 0° (sin $\omega t$), 22.5° (sin $\omega t+\Delta\theta$), 45° (sin $\omega t+2\Delta\theta$), 67.5° (sin $\omega t+3\Delta\theta$), 90° (sin $\omega t+4\Delta\theta$), 112.5° (sin $\omega t+5\Delta\theta$), 135° (sin $\omega t+6\Delta\theta$), 157.5° (sin $\omega t+7\Delta\theta$), 180° (sin $\omega t+8\Delta\theta$), 202.5° (sin$\omega t+9\Delta\theta$), 225° (sin$\omega t+10\Delta\theta$), 247.5° (sin$\omega t+11\Delta\theta$), 270° (sin $\omega t+12\Delta\theta$), 292.5° (sin $\omega t+13\Delta\theta$), 315° (sin $\omega t+14\Delta\theta$), and 337.5° (sin $\omega t+15\Delta\theta$) as indicated in FIG. 1. These phase shifted output signals from the amplifiers 41 through 56 are respectively applied to gate circuits 61 through 76, which, in turn, are respectively enabled by enabling signal outputs from AND-gates 81 through 96 in order to selectively allow the phase shifted output signals to pass through a filter 99, which filters out undesirable frequencies outside the band pass of the filter, in order to develop an output signal at a desired frequency $f_o$. The mechanization for enabling the AND-gates 81 through 96 will now be discussed.

The 640 kHz. signal $f_r$ from the reference oscillator 11 is also applied to a frequency scaler circuit 101, similar to the frequency scaler circuit 13 but operated for this discussion as a frequency multiplier, which multiplies the frequency $f_r$ by a factor X. The output signal from the frequency scaler circuit 101 is applied to a conventional clock generator 103 which produces output streams of clock pulses CP1 and CP2 which are phase shifted in time from each other but at a common frequency $f_c$. The value of X may be chosen so that the frequency $f_c$ is 16 times the largest frequency deviation ($\Delta f$) expected from the system. Assume, for example, that it is desired to operate the system at any given frequency within the range from 320 to 400 kHz. In this example the largest frequency deviation ($\Delta f$) is 80 kHz. As a result, the value of X will be chosen to be "two" so that the frequency $f_c$ of the clock generator 103 will be 1.28 MHz.

The CP1 and CP2 pulses are respectively applied as synchronizing pulses to storage registers 105 and 107 which are coupled to each other and to an adder 109. The storage registers 105 and 107 may each be comprised of a plurality of independently operable J–K flip-flops (not shown), wherein each flip-flop has J and K inputs and Q and $\overline{Q}$ outputs and transfers the logical state present at its J input to its Q output at each corresponding clock pulse time, as is well known to those skilled in the art. At each CP1 clock pulse time the digital information stored in the storage register 107 is allowed to be passed into and stored in the storage register 105, with the output of the storage register 105 being applied to the adder 109. A multibit binary word, which may be 20 bits in length, for example, is applied to and stored in a storage register 111, similar to the storage registers 105 and 107. This binary word, which controls the output frequency $f_o$ from the filter 99, as will be subsequently explained, is applied from some external source (not shown) which may be a computer, a set of flip-flops, a set of switches, or any suitable source of a multibit binary word. It should however be realized that this binary word may also be generated internally by the storage register 111 by, for example, a set of switches contained therein and positioned to develop the desired binary word. The binary word that is stored in the storage register 111 is applied to the adder 109 where it is added to the output of the storage register 105 to produce a sum of these two binary quantities. The sum from the adder 109 is applied to the input of the storage register 107. At the time of the CP2 clock pulse, the output sum of the adder 109, which is now in a stabilized condition, is allowed to be temporarily stored in the storage register 107. At the next CP1 clock pulse time, the output of the storage register 107 is stored in the storage register 105. This operation continues such that at each CP1 clock pulse time the output of the storage register 107 is stored in the storage register 105, and at each CP2 clock pulse time the sum from the adder 109 is stored in the storage register 107. It should be noted at this time that for proper system operation the bit length of the adder 109 and storage registers 105 and 107 should each be three or four bits longer than the storage capacity of the register 111.

To further explain the system operation, assume that the system of FIG. 1 is in its initial operation and no information is stored in either of the storage registers 105 and 107 and that the designated binary word is M. The binary word M is continually presented to and stored in the storage register 111 to command the desired output frequency $f_o$. At the first CP1 clock pulse time the "*O*" output from the register 107 is stored in the register 105 and presented to the input of the adder 109 to be summed with the binary word M to produce the sum M. At the first CP2 clock pulse time the stabilized sum M is applied to and stored in the register 107. At the second CP1 clock pulse time the M in the register 107 is stored in the register 105 and applied to the adder 109 to be summed with the M from the register 111 to produce the sum 2M. At the second CP2 clock pulse time the stabilized output sum 2M from the adder 109 is stored in the register 107. At the third CP1 clock pulse time the 2M output of the register 107 is stored in the register 105 and added in the adder 109 to the M in the register 111 to produce the sum of 3M. At the third CP2 clock pulse time the stabilized output sum 3M of the adder 109 is stored in the register 107. From the foregoing discussion it can be seen that at each CP1 clock pulse time whatever digital information was contained at the input of the register 105 immediately before the clock pulse now appears at the output of the register 105 after the occurrence of the CP1 clock pulse. This same conclusion is equally true of the register 107 in relation to each CP2 clock pulse. Furthermore, it can be seen that the binary quantity being applied from the register 105 continually increases until the adder 109 exceeds its adding capacity and overflows. The overflow from the adder 109 is retained by the adder 109 and, at the next occurrence of the CP2 clock pulse, stored in the register 107. At the occurrence of the following CP1 clock pulse the previous overflow from the adder 109 is stored in the register 105. Thus, in operation the binary number output of the register 105 increases in amplitude from a minimum value to a maximum value and then drops to a minimum value determined by the amplitude of the overflow, if any, from the adder 109, and then selectively repeats at a rate determined by the amplitude of the binary word, the clock pulse frequency $f_c$ and the storage capacities of the adder 109 and registers 105 and 107.

The four most significant bits being stored in the register 105 are commonly applied to the AND-gates 81 through 96, which are respectively enabled when the four most significant bits have the respective logical states of: 0000, 0001, 0010, 0011, 0100, 0101, 0110, 0111, 1000, 1001, 1010, 1011, 1100, 1101, 1110 and 1111, as indicated in FIG. 1. As the AND-gates 81 through 96 are selectively allowed to produce the enabling signals therefrom by the four most significant bits from the register 105, the gates 61 through 76 are selectively opened by the enabling signals to allow the incremental phase shift signals from the amplifiers 41 through 56 to pass therethrough and through the filter 99 to synthesize the desired frequency $f_o$, as shown by the series of sinusoids in FIG. 2.

As specified previously the adding capacity of the adder 109 and the storage capacities of the registers 105 and 107 are equal in lengths. Therefore, the smallest increment of frequency deviation of $f_o$ from the frequency $f_r$ of the reference oscillator 11 depends basically on the length of the register 111, which limits the maximum number of different output frequencies ($f_o$) within the desired operating frequency range that the system can command. For example, with an adder 109 length of 13 or 14 bits and a register 111 length of 10 bits, the system would have a frequency resolution of 1 part in 1,024. Where $f_r$=640 kHz., the signal sin $\omega t$=320 kHz., the maximum frequency deviation ($\omega f$)=80 kHz., and $f_c$=1.28 MHz, these respective lengths mean that there would be 1,024 different frequencies between 320 kHz. and 400 kHz. which could be chosen by changing the amplitude of the binary word being applied to the register 111. Similarly, with an adder 109 length of 23 or 24 bits and a register 111 length of 20 bits, the system could provide a frequency resolution of more than 1 part in a million.

In review, the amplitude of the binary word being applied to the register 111, in conjunction with the frequency of the signal sin $\omega t$, controls the output frequency $f_o$ of the filter 99 by determining the rate at which the adder 109 overflows and hence the rate at which the phase shift increments are selectively applied to the filter 99; the frequency $f_c$ of the clock generator 103 determines the output frequency deviation $\Delta f$; and basically the length of the register 111 determines the maximum number of output frequencies $f_o$ at which the system can operate within a given frequency range. It should be further noted that a change in the clock generator 103 frequency $f_c$ could also control the output frequency by determining the rate that the adder 109 overflows.

Figure 3:
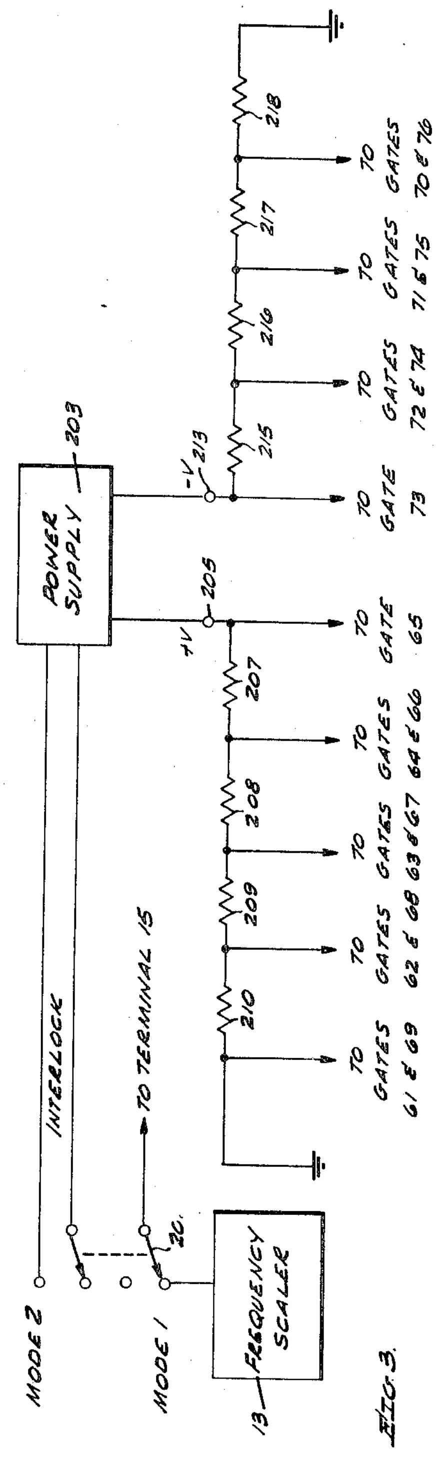
FIG. 3 is a schematic circuit and block diagram of a modification of the embodiment of FIG. 1 to produce a second embodiment of this invention.

FIG. 3 reveals a modification of the embodiment of FIG. 1 to produce a second embodiment of this invention. This embodiment may be used when it is desirable to operate the system within a frequency range of from a DC voltage level up to some high-frequency limit. In this second embodiment the output signal from the frequency scaler 13 is applied to a ganged, four-pole, two-position mode selector switch 201. When the mode selector switch 201 is in the position shown, the system is in a mode 1 operation and the signal sin $\omega t$ is applied through the switch 201 to terminal 15 to initiate the operation as described in relation to the embodiment of FIG. 1 in order to develop the output frequency $f_o$ within the frequency range of, for example, from 320 to 400 kHz.

When it is desired to operate the system in a lower frequency range, assuming that a frequency deviation or $\Delta f$ of 80 kHz. is desired, the mode selector switch 201 is placed in the opposite position from that shown, which is the mode 2 position. In this position an interlock circuit in a power supply 203 is completed enabling the power supply 203 to develop positive and negative voltages ± v., which for example may be positive and negative 1 volt. The +1 v. from the power supply 203 is applied to a terminal 205. Serially connected resistors 207 through 210 are connected between the terminal 205 and ground in order to develop voltages of: +1.0000 v. at the terminal 205, +0.9239 v. at the junction of resistors 207 and 208, +0.7071 v. at the junction of resistors 208 and 209, +0.3827 v. at the junction of resistors 209 and 210, and 0.0000 v. at ground. These voltages of +1.0000, +0.9239, + 0.7071, +0.3827 and 0.0000, which respectively represent the sines of 90°, 67.5° and 112.5°, 45° and 135°, 22.5° and 157.5°, and 0° and 180°, are applied to the gates 65, 64 and 66, 63 and 67, 62 and 68, and 61 and 69, respectively.

The negative 1 volt from the power supply 203 is applied to a terminal 213. Serially connected resistors 215 through 218 are connected between the terminal 213 and ground in order to develop the voltages of: −1.0000 v. at the terminal 213, −0.9239 v. at the junction of resistors 215 and 216, −0.7071 v. at the junction of resistors 216 and 217, and −0.3827 v. at the junction of resistors 217 and 218. These voltages of −1.0000, −0.9239, −0.7071, and −0.3827 v., which respectively represent the sines of 270°, 247.5° and 292.5°, 225° and 315°, and 202.5° and 337.5°, are applied to the gates 73, 72 and 74, 71 and 75, and 70 and 76, respectively.

Figure 4:
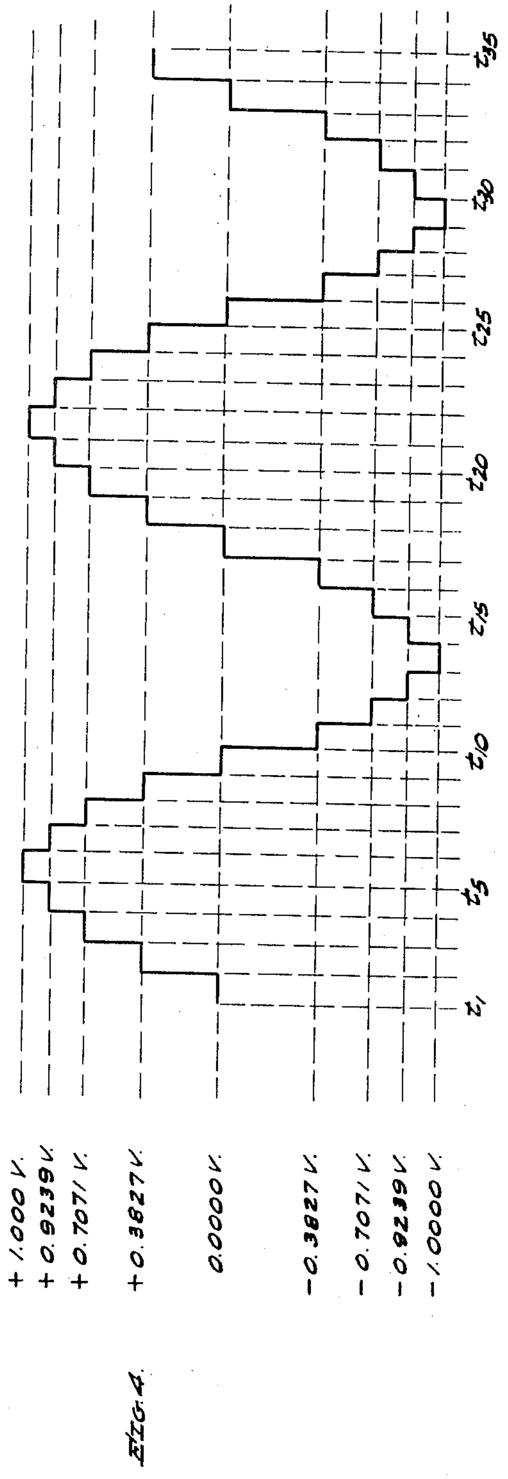
FIG. 4 is a graph which illustrates the stepped sine wave of the embodiment of FIG. 3.

The gates 61 through 76 are selectively enabled by the enabling signals from the AND-gates 81 through 96 in order to selectively pass the phase shift increments from the network resistors 207–210 and 215–218 to the filter 99 in the same manner as described in relation to the embodiment of FIG. 1. However, in the embodiment of FIG. 3 the outputs of the gates 61 through 76 produce the stepped sine wave signal of FIG. 4 rather than the series of sinusoids of FIG. 2. This stepped sine wave signal is at a synthesized frequency which is shown in FIG. 4 varying from +1 v. to −1 v. from time $t_1$ to time $t_{35}$. The frequency of this stepped sine wave output may be varied in the same manner as discussed in relation to the embodiment of FIG. 1, and then applied to the filter 99 for removing unwanted frequencies outside of the band pass of the filter.

Figure 2:
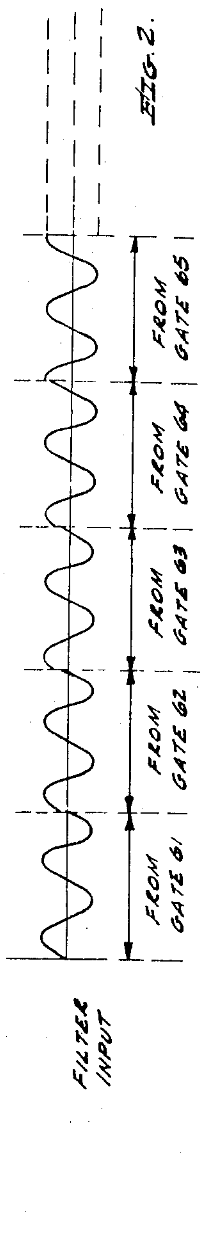
FIG. 2 is a graph of a series of sinusoids at the input of the filter 99 of FIG. 1.

In the embodiment of FIG. 1 (as well as the embodiment of FIG. 3) the four most significant bits from the register 105 were utilized by the gates 81 through 96 to selectively allow the gates 61 through 76 to pass the 16 different values of phase shift increments to the filter 99. These phase shift increments provide some harmonic distortion of the sine wave input to the filter 99, as shown in FIG. 2. It has been found by analysis that the amount of harmonic distortion of the output sine wave is an inverse function of the number of phase shift increments employed to accomplish a phase rotation of the sine wave signal of the output frequency $f_o$. This analysis has shown that with each doubling of the number of phase shift increments in relation to one cycle of the sine wave output, there is approximately a 6 db. reduction in the harmonic distortion in the output. In the system shown in FIG. 1, wherein 16 phase shift increments (four bits from the register 105) are developed, the first harmonic would be attenuated by approximately 23 db., with even greater attenuation for the other harmonics. As the number of phase shift increments is doubled, the most significant harmonic will decrease at an approximate rate of 6 db. per bit. The number of phase shift increments can be doubled in the embodiments of FIG. 1 by utilizing five-input AND gates in place of the four-input AND-gates (81–96), by doubling the number of terminals (21–36), amplifiers (41–56), gates (61–76) and AND-gates (81–96), and by utilizing the five most significant bits from the register 105 to control the new five-input AND gates.

In the embodiment of FIG. 3, the number of phase shift increments can be doubled in the same manner as that described in relation to FIG. 1, with the exception that the terminals (21–36) and amplifiers (41–56) are not used while the number of network resistors (207–210 and 215–218) are doubled. However, since $\Delta f$, $f_c$ and $\Delta\theta$ are related to each other by the equation $\Delta f = f_c \cdot \Delta\theta$, a halving of $\Delta\theta$ (by doubling the number of phase shift increments) will cause the frequency deviation $\Delta f$ to decrease by a factor of two. Consequently, the clock generator frequency $f_c$ must be doubled (via the frequency scaler circuit 101) if it is desired to have $\Delta f$ remain constant.

The invention thus provides a system wherein digital quantities corresponding to incremental phase shifts are accumulated at a predetermined rate and utilized to selectively gate a plurality of phase shifted increments of the output signal of a reference oscillator to synthesize any desired output frequency within a preselected frequency band.

While the salient features have been illustrated and described with respect to one embodiment, it should be readily apparent to those skilled in the art that modifications can be made within the spirit and scope of the invention as set forth in the appended claims. For example, the embodiments of FIGS. 1 and 3 could be mechanized in different manners to prevent an undue multiplicity of components by making use of the symmetrical properties of sines and cosines in different gating arrangements; the frequencies of the reference oscillator 11 and clock generator 103 do not have to be related by harmonics or subharmonics of each other; the embodiments of FIGS. 1 and 3 could be combined to share common components while producing a dual-mode operation, as indicated in FIG. 3, or could be mechanized to produce the Mode 1 and Mode 2 operations in separate physical units; and in some arrangements one or both of the frequency scaler circuits 13 and 101 can be omitted.

What is claimed is:

1. A frequency synthesizer system comprising:

first oscillator means for developing a sequence of sinusoidal signals;

second oscillator means coupled to said first oscillator means for developing sequences of first and second signals as a function of the sequence of sinusoidal signals applied thereto, the first and second signals being phase coherent with the sinusoidal signals;

phase shift means coupled to said first oscillator means for producing a plurality of sinusoidal phase shift increments in response to the sinusoidal signals;

first means coupled to said second oscillator means for sequentially developing a plurality of multibit numbers in response to the first and second signals; and gating means having a common output terminal and respectively coupled to said phase shift means and said first means and being responsive to the plurality of multibit numbers therefrom for selectively passing to said common output terminal the plurality of phase shift increments to synthesize a desired output frequency.

2. The system of claim 1 wherein said first means includes:

a first storage register for developing a digital frequency command number;

a second storage register coupled to said first storage register and being responsive to each of the second signals and the command number for sequentially developing the plurality of multibit numbers; and a third storage register coupled to said second storage register and said gating means for sequentially applying the plurality of multibit numbers to said gating means in response to the first signals.

3. The system of claim 1 wherein said gating means includes:

a first plurality of gates coupled to said first means for selectively developing enabling signals in response to the plurality of multibit numbers; and a second plurality of gates respectively coupled to said first plurality of gates and said phase shift means for synthesizing the desired output frequency in response to the enabling signals and the plurality of sinusoidal phase shift increments.

4. The system of claim 3 wherein said first means includes:

a first storage register for developing a digital frequency command number;

a second storage register coupled to said first storage register and being responsive to each of the second signals and the command number for sequentially developing the plurality of multibit numbers; and a third storage register coupled to each of said first plurality of gates and to said second storage register for sequentially applying the plurality of multibit numbers to said gating means in response to the first signals.

5. The system of claim 1 wherein said phase shift means includes a tapped resistor network for producing the plurality of sinusoidal phase shift increments.

6. The system of claim 5 wherein said first means includes:

a first storage register for developing a digital frequency command number;

a second storage register coupled to said first storage register and being responsive to each of the second signals and the command number for sequentially developing the plurality of multibit numbers; and a third storage register coupled to said second storage register and said gating means for sequentially applying the plurality of multibit numbers to said gating means in response to the first signals.

7. The system of claim 5 wherein said gating means includes:

a first plurality of gates coupled to said first means for selectively developing enabling signals in response to the plurality of multibit numbers; and a second plurality of gates respectively coupled to said first plurality of gates and said phase shift means for synthesizing the desired output frequency in response to the enabling signals and the plurality of sinusoidal phase shift increments.

8. The system of claim 7 wherein said first means includes:

a first storage register for developing a digital frequency command number;

a second storage register coupled to said first storage register and being responsive to each of the second signals and the command number for sequentially developing the plurality of multibit numbers; and a third storage register coupled to said second storage register and said gating means for sequentially applying the plurality of multibit numbers to said gating means in response to the first signals.

9. The system of claim 8 further including:

a circuit coupled to said gating means for filtering undesirable frequencies from the plurality of phase shift increments being passed.

10. The system of claim 1 further including:

second means coupled between said first oscillator means and said phase shift means for converting the sinusoidal signals into frequency-scaled sinusoidal signals; said phase shift means being responsive to the frequency-scaled sinusoidal signals for producing the plurality of phase shift increments.

11. The system of claim 10 wherein said phase shift means includes a tapped delay line.

12. The system of claim 11 wherein said first means includes:

a first storage register for developing a digital frequency command number;

a second storage register coupled to said first storage register and being responsive to each of the second signals and the command number for sequentially developing the plurality of multibit numbers; and a third storage register coupled to said second storage register and said gating means for sequentially applying the plurality of multibit numbers to said gating means in response to the first signals.

13. The system of claim 11 wherein said gating means includes:

a first plurality of gates coupled to said first means for selectively developing enabling signals in response to the plurality of multibit numbers; and a second plurality of gates respectively coupled to said first plurality of gates and said phase shift means for synthesizing the desired output frequency in response to the enabling signals and the plurality of frequency-scaled sinusoidal phase shift increments.

14. The system of claim 13 wherein said first means includes:

a first storage register for developing a digital frequency command number;

a second storage register coupled to said first storage register and being responsive to each of the second signals and the command number for sequentially developing the plurality of multibit numbers; and a third storage register coupled to said second storage register and said gating means for sequentially applying the plurality of multibit numbers to said gating means in response to the first signals.

15. The system of claim 1 wherein said second oscillator means includes:

a first frequency multiplier coupled to said first oscillator means for frequency multiplying the sinusoidal signal to develop a third signal; and a clock generator coupled to said frequency multiplier for developing the first and second signals in response to said third signal.

16. The system of claim 1 wherein said second oscillator means includes:

a first frequency divider coupled to said first oscillator means for frequency dividing the sinusoidal signal to develop a fourth signal; and a clock generator coupled to said frequency divider for developing the first and second signals in response to said fourth signal.

17. The system of claim 1 wherein said first means includes:

a first storage register for developing a digital frequency command number;

a second storage register coupled to said first storage register and being responsive to each of the second signals and the command number for sequentially developing the plurality of multibit numbers; and a third storage register coupled to said second storage register and said gating means for sequentially applying the plurality of multibit numbers to said gating means in response to the first signals.

18. The system of claim 1 wherein said gating means includes:

a first plurality of gates coupled to said first means for selectively developing enabling signals in response to the plurality of multibit numbers; and a second plurality of gates respectively coupled to said first plurality of gates and said phase shift means for synthesizing the desired output frequency in response to the enabling signals and the plurality of sinusoidal phase shift increments.

19. The system of claim 18 wherein said first means includes:

a first storage register for developing a digital frequency command number;

a second storage register coupled to said first storage register and being responsive to each of the second signals and the command number for sequentially developing the plurality of multibit numbers; and a third storage register coupled to said second storage register and said gating means for sequentially applying the plurality of multibit numbers to said gating means in response to the first signals.

20. The system of claim 19 further including:

a circuit coupled to said gating means for filtering undesirable frequencies from the plurality of sinusoidal phase shift increments being passed.

21. The system of claim 10 wherein:

said second means is a second frequency multiplier for frequency multiplying the sinusoidal signals to develop the frequency-scaled sinusoidal signals.

22. The system of claim 10 wherein:

said second means is a second frequency divider for frequency dividing the sinusoidal signals to develop the frequency-scaled sinusoidal signals.

23. A frequency synthesizer comprising:

an oscillator for developing a sinusoidal signal;

a phase shifter circuit coupled to said oscillator for phase shifting the sinusoidal signal to produce a plurality of sinusoidal phase shift increments;

a clock generator coupled to said oscillator for generating sequences of first and second signals in response to the sinusoidal signals;

storage means coupled to said clock generator and being responsive to the first and second signals therefrom for sequentially developing a plurality of multibit numbers; and gating means having a common output terminal and respectively coupled to said phase shifter circuit and said register means and being responsive to the plurality of multibit numbers therefrom for selectively passing to said common output terminal the plurality of sinusoidal phase shift increments to synthesize a desired output frequency.

* * * * *

PO-1050
(5/69)

UNITED STATES PATENT OFFICE
CERTIFICATE OF CORRECTION

Patent No. 3,641,442 Dated February 8, 1972

Inventor(s) ROBERT J. BOUCHER

It is certified that error appears in the above-identified patent and that said Letters Patent are hereby corrected as shown below:

Column 4, line 51, change "($\omega$f)" to --($\Delta$f)--.

Claim 23, Column 10, lines 14 and 15, change "register" to --storage--.

Signed and sealed this 25th day of July 1972.

(SEAL)
Attest:

EDWARD M.FLETCHER,JR.
Attesting Officer

ROBERT GOTTSCHALK
Commissioner of Patents